United States Patent
Yokoyama et al.

(10) Patent No.: US 10,187,036 B2
(45) Date of Patent: Jan. 22, 2019

(54) PIEZOELECTRIC THIN FILM RESONATOR, FILTER, DUPLEXER, AND METHOD OF FABRICATING PIEZOELECTRIC THIN FILM RESONATOR

(71) Applicant: TAIYO YUDEN CO., LTD., Tokyo (JP)

(72) Inventors: Tsuyoshi Yokoyama, Tokyo (JP); Tokihiro Nishihara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 35 days.

(21) Appl. No.: 15/616,080

(22) Filed: Jun. 7, 2017

(65) Prior Publication Data

US 2018/0026604 A1    Jan. 25, 2018

(30) Foreign Application Priority Data

Jul. 21, 2016   (JP) .................. 2016-143660

(51) Int. Cl.
*H03H 3/02*    (2006.01)
*H03H 9/17*    (2006.01)
(Continued)

(52) U.S. Cl.
CPC .......... *H03H 9/17* (2013.01); *H01L 41/0472* (2013.01); *H01L 41/081* (2013.01); *H01L 41/18* (2013.01); *H01L 41/293* (2013.01); *H01L 41/314* (2013.01); *H03H 3/02* (2013.01); *H03H 9/02015* (2013.01); *H03H 9/173* (2013.01); *H03H 9/174* (2013.01); *H03H 9/175* (2013.01); *H03H 9/54* (2013.01); *H03H 9/706* (2013.01); *H03H 9/605* (2013.01)

(58) Field of Classification Search
CPC ...... H03H 9/17; H03H 9/02015; H03H 9/173; H03H 9/174; H03H 9/175; H03H 9/54; H03H 9/706; H03H 3/02; H01L 41/0472; H01L 41/081; H01L 41/18; H01L 41/293; H01L 41/314
USPC ........................................ 333/133
See application file for complete search history.

(56) References Cited

U.S. PATENT DOCUMENTS

2013/0127300 A1    5/2013  Umeda et al.
2013/0241673 A1    9/2013  Yokoyama et al.
(Continued)

FOREIGN PATENT DOCUMENTS

JP    2013-128267 A    6/2013
JP    2013-219743 A    10/2013
JP    2014-121025 A    6/2014

*Primary Examiner* — Stephen E. Jones
*Assistant Examiner* — Samuel S Outten
(74) *Attorney, Agent, or Firm* — Chen Yoshimura LLP

(57) ABSTRACT

A piezoelectric thin film resonator includes: a substrate; a piezoelectric film located on the substrate, the piezoelectric film including an aluminum nitride film containing a II-group or XII-group element and a IV-group or V-group element, a concentration of the IV-group or V-group element being higher than a concentration of the II-group or XII-group element in a middle region in a thickness direction, the concentration of the II-group or XII-group element being higher than the concentration of the IV-group or V-group element in at least one of end regions in the thickness direction; and a lower electrode and an upper electrode facing each other across the piezoelectric film.

9 Claims, 12 Drawing Sheets

(51) Int. Cl.
  *H03H 9/54* (2006.01)
  *H03H 9/70* (2006.01)
  *H01L 41/08* (2006.01)
  *H01L 41/18* (2006.01)
  *H01L 41/047* (2006.01)
  *H01L 41/293* (2013.01)
  *H01L 41/314* (2013.01)
  *H03H 9/02* (2006.01)
  *H03H 9/60* (2006.01)

(56) References Cited

U.S. PATENT DOCUMENTS

2014/0167560 A1 6/2014 Onda
2015/0357555 A1* 12/2015 Umeda ................ H01L 41/316
 310/322

\* cited by examiner

PIEZOELECTRIC THIN FILM RESONATOR, FILTER, DUPLEXER, AND METHOD OF FABRICATING PIEZOELECTRIC THIN FILM RESONATOR

CROSS-REFERENCE TO RELATED APPLICATION

This application is based upon and claims the benefit of priority of the prior Japanese Patent Application No. 2016-143660, filed on Jul. 21, 2016, the entire contents of which are incorporated herein by reference.

FIELD

A certain aspect of the present invention relates to a piezoelectric thin film resonator, a filter, a duplexer, and a method of fabricating the piezoelectric thin film resonator.

BACKGROUND

Piezoelectric thin film resonators have been used for filters of wireless communication devices such as mobile phones. The piezoelectric thin film resonator includes a piezoelectric film, and a lower electrode and an upper electrode facing each other across the piezoelectric film. In recent years, to improve the performance of the wireless communication devices, it is desired to broaden the band of the filter characteristics. The band of the filter characteristics can be broadened by increasing the electromechanical coupling coefficient of a piezoelectric thin film resonator used in the filter. The electromechanical coupling coefficient of the piezoelectric thin film resonator can be increased by using a piezoelectric film with a large electromechanical coupling coefficient.

For example, it has been known that the electromechanical coupling coefficient can be increased by using an aluminum nitride film containing a II-group or XII-group element and a IV-group or V-group element for the piezoelectric film as disclosed in, for example, Japanese Patent Application Publication No. 2013-219743. In addition, it has been known to make the concentration of an additive element in an end region in the thickness direction of the piezoelectric film lower than that in a middle region, the piezoelectric film using an aluminum nitride film containing the additive element as disclosed in, for example, Japanese Patent Application Publication No. 2014-121025. It has been also known to use an aluminum nitride film containing scandium for the piezoelectric film as disclosed in, for example, Japanese Patent Application Publication No. 2013-128267.

Use of an aluminum nitride film containing a II-group or XII-group element and a IV-group or V-group element for the piezoelectric film increases the electromechanical coupling coefficient, but decreases the Q-value that is in a trade-off relationship with the electromechanical coupling coefficient

SUMMARY OF THE INVENTION

According to a first aspect of the present invention, there is provided a piezoelectric thin film resonator including: a substrate; a piezoelectric film located on the substrate, the piezoelectric film including an aluminum nitride film containing a II-group or XII-group element and a IV-group or V-group element, a concentration of the IV-group or V-group element being higher than a concentration of the II-group or XII-group element in a middle region in a thickness direction, the concentration of the II-group or XII-group element being higher than the concentration of the IV-group or V-group element in at least one of end regions in the thickness direction; and a lower electrode and an upper electrode facing each other across the piezoelectric film.

According to a second aspect of the present invention, there is provided a filter including the above piezoelectric thin film resonator.

According to a third aspect of the present invention, there is provided a duplexer including the above filter.

According to a fourth aspect of the present invention, there is provided a method of fabricating a piezoelectric thin film resonator, the method including: forming a piezoelectric film on a lower electrode by sputtering using a target containing aluminum, a II-group or XII-group element, and a IV-group or V-group element, the piezoelectric film including an aluminum nitride film of which a concentration of the IV-group or V-group element in a middle region in a thickness direction is higher than a concentration of the IV-group or V-group element in at least one of end regions in the thickness direction, the aluminum nitride film being formed by changing a sputtering power between the middle region and the at least one of the end regions in the thickness direction in the sputtering; and forming an upper electrode on the piezoelectric film, the upper electrode facing the lower electrode across the piezoelectric film.

DETAILED DESCRIPTION

Hereinafter, embodiments of the present invention will be described with reference to the accompanying drawings. In the description hereinafter, the group number is based on the International Union of Pure and Applied Chemistry (IU-PAC) nomenclature.

First Embodiment

Figure 1:
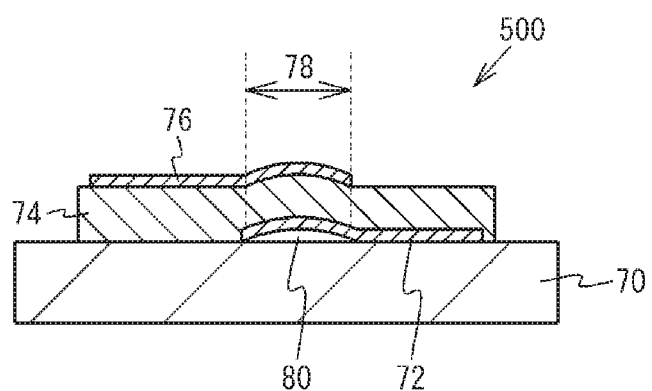
FIG. 1 is a cross-sectional view of a piezoelectric thin film resonator in accordance with a comparative example.

FIG. 1 is a cross-sectional view of a piezoelectric thin film resonator in accordance with a comparative example. As illustrated in FIG. 1, a piezoelectric thin film resonator 500 of the comparative example includes a lower electrode 72 located on a substrate 70. A piezoelectric film 74 is located on the substrate 70 and the lower electrode 72. Located on the piezoelectric film 74 is an upper electrode 76 having a region (a resonance region 78) in which the upper electrode 76 faces the lower electrode 72 across the piezoelectric film 74. An air gap 80 is located between the substrate 70 and the lower electrode 72 in the resonance region 78.

The piezoelectric film 74 is an aluminum nitride (AlN) film containing a II-group or XII-group element and a IV-group element. The concentration of the II-group or XII-group element is constant across the piezoelectric film 74, and the concentration of the IV-group element is also constant across the piezoelectric film 74. The II-group or XII-group element and the IV-group element substitute aluminum in the AlN film. The II-group or XII-group element substitutes aluminum, which is a XIII-group element, and the IV-group element also substitutes aluminum, which is a XIII-group element. Thus, the insulation property of the AlN film is maintained.

Here, when the sum of the number of atoms of aluminum and the number of atoms of additive elements (here, a II-group or XII-group element and a IV-group element) is defined as 100 atomic %, the ratio of the number of atoms of the additive element is called the concentration of the additive element. For example, in AlN composed of 16 aluminum atoms and 16 nitrogen atoms, when one II-group or XII-group element and one IV-group element substitute aluminum atoms (i.e., when the number of aluminum atoms is 14, the number of nitrogen atoms is 16, the number of atoms of the II-group or XII-group element is 1, and the number of atoms of the IV-group element is 1), the concentration of the II-group or XII-group element is 6.25 atomic %, and the concentration of the IV-group element is also 6.25 atomic %.

Here, a description will be given of an experiment that examined the relationship between the electromechanical coupling coefficient $k^2$ and the Q-value at the antiresonant frequency of the piezoelectric thin film resonator 500 of the comparative example and the concentration of the additive element in the AlN film. In the experiment, the lower electrode 72 was configured to have a two-layer structure having a chrome film with a film thickness of 100 nm and a ruthenium film with a film thickness of 200 nm stacked in this order from the substrate side. The piezoelectric film 74 was an AlN film with a film thickness of 1150 nm containing magnesium (Mg) as a II-group or XII-group element and hafnium (Hf) as a IV-group element. The upper electrode 76 was configured to have a two-layer structure having a ruthenium film with a film thickness of 200 nm and a chrome film with a film thickness of 50 nm stacked in this order from the piezoelectric film 74 side. The piezoelectric film 74 was formed by sputtering using two targets: an aluminum target and an alloy target of aluminum, magnesium, and hafnium. As the alloy target of aluminum, magnesium, and hafnium, used was an alloy target having a composition of 80 atomic % aluminum, 10 atomic % magnesium, and 10 atomic % hafnium when the sum concentration of aluminum, magnesium, and hafnium is defined as 100 atomic %. In addition, the sum concentration of Mg and Hf was varied by changing a power applied to the aluminum target for film formation and a power applied to the alloy target of aluminum, magnesium, and hafnium for film formation using the above-described target.

Figure 2A:
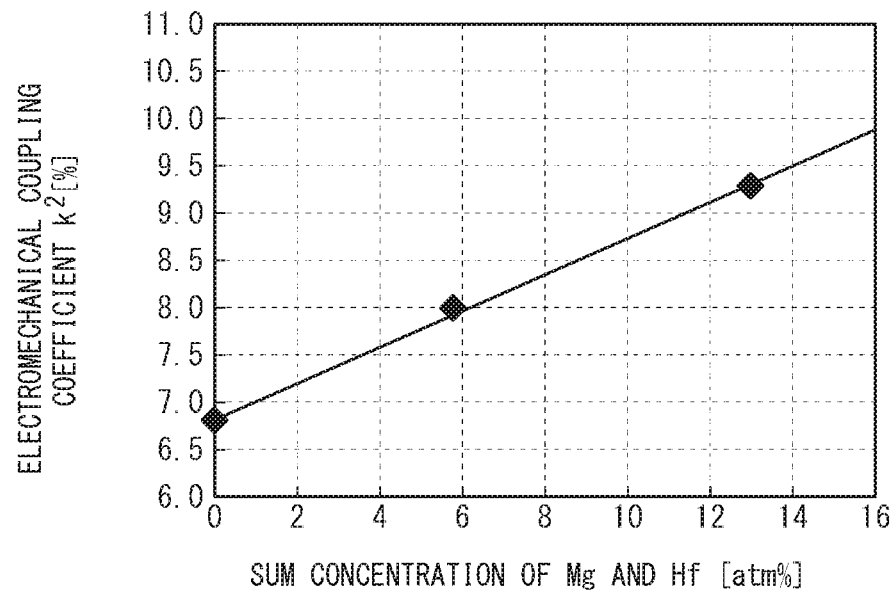
FIG. 2A illustrates a relationship between a sum concentration of Mg and Hf and an electromechanical coupling coefficient $k^2$.
Figure 2B:
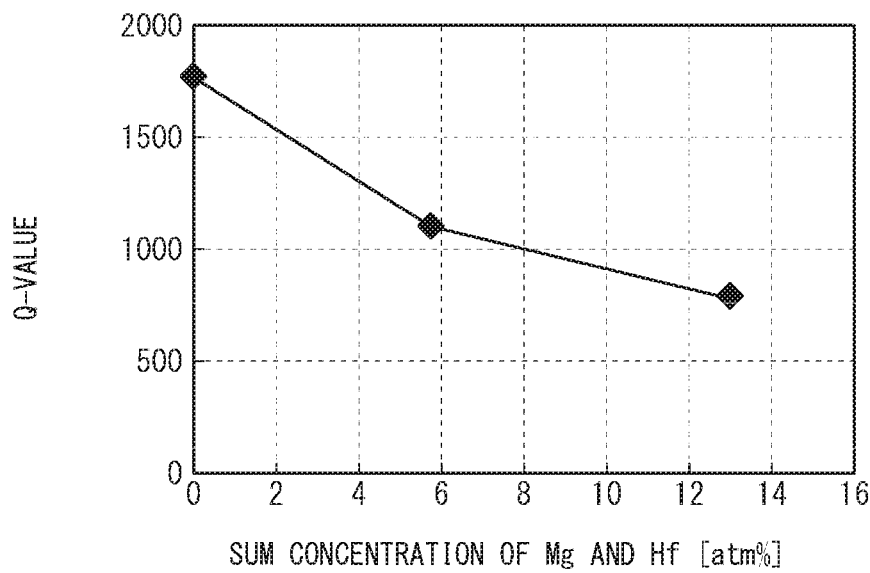
FIG. 2B illustrates a relationship between the sum concentration of Mg and Hf and a Q-value.

FIG. 2A illustrates a relationship between the sum concentration of Mg and Hf and the electromechanical coupling coefficient $k^2$, and FIG. 2B illustrates a relationship between the sum concentration of Mg and Hf and the Q-value. In FIG. 2A, the horizontal axis represents the sum concentration of Mg and Hf (the concentration of Mg+ the concentration of Hf), while the vertical axis represents the electromechanical coupling coefficient $k^2$. In FIG. 2B, the horizontal axis represents the sum concentration of Mg and Hf (the concentration of Mg+ the concentration of Hf), while the vertical axis represents the Q-value at the antiresonant frequency. The ratio of the concentration of Mg and the concentration of Hf was configured so as to be 1:1. As illustrated in FIG. 2A, as the sum concentration of Mg and Hf increased, the electromechanical coupling coefficient $k^2$ increased. On the other hand, as illustrated in FIG. 2B, as the sum concentration of Mg and Hf increased, the Q-value at the antiresonant frequency decreased. These results reveal that the electromechanical coupling coefficient $k^2$ and the Q-value are in a trade-off relationship.

In the above experiment, the II-group or XII-group element was Mg and the IV-group element was Hf, but this does not intend to suggest any limitation. The following presents simulation results of the electromechanical coupling coefficients $k^2$ of the piezoelectric thin film resonator using various elements for the II-group or XII-group element and the IV-group element. In the simulation, the lower electrode 72 was assumed to be formed of a multilayered film including a chrome (Cr) film with a film thickness of 100 nm and a ruthenium (Ru) film with a film thickness of 225 nm. The piezoelectric film 74 was assumed to be an AlN film with a film thickness of 1000 nm containing a II-group or XII-group element and a IV-group element. Used as the II-group or XII-group element was magnesium (Mg), calcium (Ca), strontium (Sr), or zinc (Zn), and used as the IV-group element was titanium (Ti), zirconium (Zr), or hafnium (Hf). The II-group or XII-group element and the IV-group element were both assumed to have concentrations of 6.25 atomic %. Values calculated by the first principle calculation were used for the values of the material constants such as the piezoelectric constant, the elastic constant, and the permittivity of the piezoelectric film 74. The upper electrode 76 was assumed to be formed of a multilayered film including a Ru film with a film thickness of 225 nm and a Cr film with a film thickness of 30 nm. In addition, a silicon oxide ($SiO_2$) film with a film thickness of 50 nm was assumed to be located on the upper electrode 76.

Table 1 lists the simulation results of the piezoelectric thin film resonator and the electromechanical coupling coefficient $k^2$. For comparison, also presented are simulation results of the electromechanical coupling coefficient $k^2$ of a piezoelectric thin film resonator of which the structure is the same except that an undoped AlN film with a film thickness of 1150 nm is used for the piezoelectric film 74. Table 1 reveals that the electromechanical coupling coefficients $k^2$ of when an AlN film containing a II-group or XII-group element and a IV-group element was used for the piezoelectric film (case 1 through case 10) are larger than the electromechanical coupling coefficient $k^2$ of when an undoped AlN film was used for the piezoelectric film. In addition, since the Q-value is in a trade-off relationship with the electromechanical coupling coefficient $k^2$, the Q-value is small when an AlN film containing a II-group or XII-group element and a IV-group element was used for the piezoelectric film.

TABLE 1

| Combination | II-group or XII-group element | IV-group element | Resonant frequency [MHz] | Antiresonant frequency [MHz] | $k^2$ [%] |
|---|---|---|---|---|---|
| Case 1 | Ca | Ti | 1928.9 | 2011.9 | 9.77 |
| Case 2 | Ca | Zr | 1895.8 | 1983.2 | 10.4 |
| Case 3 | Ca | Hf | 1875.7 | 1998.3 | 14.2 |
| Case 4 | Mg | Ti | 1930.3 | 2043.8 | 12.9 |
| Case 5 | Mg | Zr | 1911.9 | 2030.3 | 13.5 |
| Case 6 | Mg | Hf | 1886.9 | 2043.9 | 17.5 |
| Case 7 | Sr | Hf | 1901.5 | 1998.3 | 11.4 |
| Case 8 | Zn | Ti | 1940.1 | 2050.4 | 12.6 |
| Case 9 | Zn | Zr | 1883.3 | 1995.0 | 12.5 |
| Case 10 | Zn | Hf | 1887.5 | 2027.7 | 15.9 |
| Aluminum nitride | — | — | 1963.0 | 2024.0 | 7.22 |

As described above, in a piezoelectric thin film resonator using an AlN film containing a II-group or XII-group element excluding radioactive elements and a IV-group element excluding radioactive elements, the electromechanical coupling coefficient $k^2$ improves, but the Q-value decreases. Thus, hereinafter, a description will be given of embodiments that improve the electromechanical coupling coefficient $k^2$ and reduces the decrease in the Q-value.

Figure 3A:
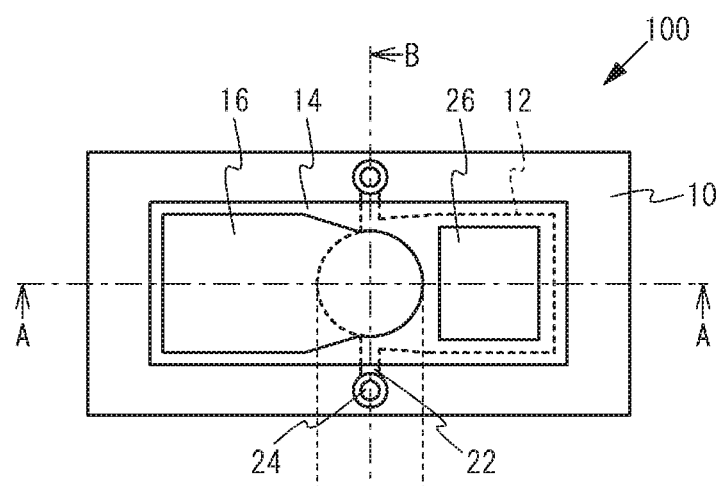
FIG. 3A is a plan view of a piezoelectric thin film resonator in accordance with a first embodiment.
Figure 3B:
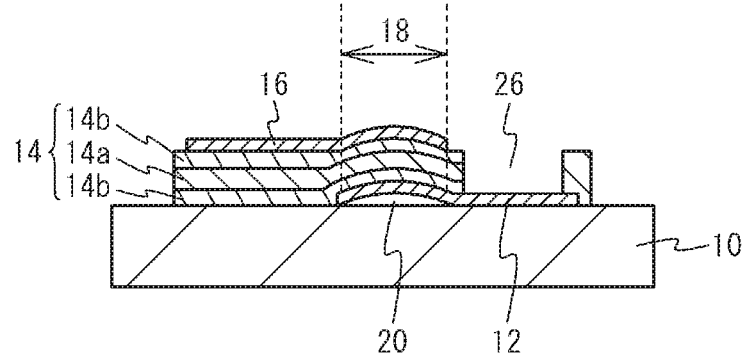
FIG. 3B is a cross-sectional view taken along line A-A in FIG. 3A.
Figure 3C:
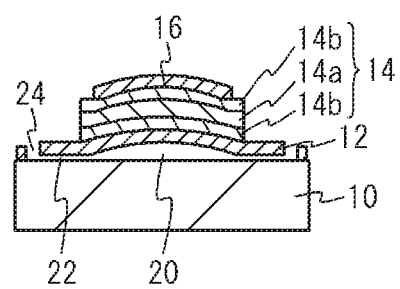
FIG. 3C is a cross-sectional view taken along line B-B in FIG. 3A.

FIG. 3A is a plan view of a piezoelectric thin film resonator in accordance with a first embodiment, FIG. 3B is a cross-sectional view taken along line A-A in FIG. 3A, and FIG. 3C is a cross-sectional view taken along line B-B in FIG. 3A. As illustrated in FIG. 3A through FIG. 3C, a piezoelectric thin film resonator 100 of the first embodiment includes a substrate 10, a lower electrode 12, a piezoelectric film 14, and an upper electrode 16.

The substrate 10 is, for example, a silicon (Si) substrate, a quartz substrate, a glass substrate, a ceramic substrate, or a gallium arsenide (GaAs) substrate.

The lower electrode 12 is located on the substrate 10. The lower electrode 12 is formed of a single layer metal film of aluminum (Al), copper (Cu), chrome (Cr), molybdenum (Mo), tungsten (W), tantalum (Ta), platinum (Pt), ruthenium (Ru), rhodium (Rh), or iridium (Ir), or a multilayered film of at least two of them.

The piezoelectric film 14 is located on the substrate 10 and the lower electrode 12. The piezoelectric film 14 is an aluminum nitride (AlN) film containing a II-group or XII-group element and a IV-group element, and has a crystal structure having the c-axis orientation of which the main axis is the c-axis. The concentration of the IV-group element of the piezoelectric film 14 differs between the end region and the middle region in the thickness direction. The concentration of the IV-group element in a first region 14*a* located in a middle region in the thickness direction of the piezoelectric film 14 is higher than the concentration of the IV-group element in second regions 14*b* located in end regions. In the first region 14*a*, the concentration of the IV-group element is greater than the concentration of the II-group or XII-group element. In the second region 14*b*, the concentration of the II-group or XII-group element is greater than the concentration of the IV-group element. As described above, the insulation property can be maintained by making a II-group or XII-group element and a IV-group element contained in an AlN film. Even when the concentration of the II-group or XII-group element and the concentration of the IV-group element are not completely the same, the insulation property of the AlN film can be maintained. Therefore, even when the concentration of the II-group or XII-group element differs from the concentration of the IV-group element, the insulation property of the AlN film is maintained.

The upper electrode 16 is located on the piezoelectric film 14 so as to have a region in which the upper electrode 16 faces the lower electrode 12. The upper electrode 16 is formed of a single layer metal film made of one of metal materials listed for the lower electrode 12, or a multilayered film of at least two of them. The region where the lower electrode 12 and the upper electrode 16 face each other across the piezoelectric film 14 is a resonance region 18. The resonance region 18 has, for example, an elliptical shape, and is a region in which the acoustic wave in the thickness extension mode resonates. The resonance region 18 may have other shapes such as a rectangular shape.

In the resonance region 18, an air gap 20 having a dome-shaped bulge toward the lower electrode 12 is located between the flat upper surface of the substrate 10 and the lower electrode 12. The dome-shaped bulge is, for example, a bulge having a shape in which the height of the air gap 20 is low in the periphery of the air gap 20, and increases at closer distances to the center of the air gap 20. An introduction path 22 formed by introducing an etchant to form the air gap 20 is located below the lower electrode 12. The vicinity of the end of the introduction path 22 is not covered with the piezoelectric film 14, and the end of the introduction path 22 is a hole 24. The hole 24 is an inlet for introducing an etchant when the air gap 20 is formed. An aperture 26 for providing an electric connection with the lower electrode 12 is located in the piezoelectric film 14.

A description will next be given of a method of fabricating the piezoelectric thin film resonator 100 of the first embodiment. FIG. 4A through FIG. 4H are cross-sectional views illustrating a method of fabricating the piezoelectric thin film resonator in accordance with the first embodiment. FIG. 4A through FIG. 4D are cross-sectional views corresponding to the cross section taken along line A-A in FIG. 3A, and FIG. 4E through FIG. 4H are cross-sectional views corresponding to the cross section taken along line B-B in FIG. 3A.

Figure 4A:
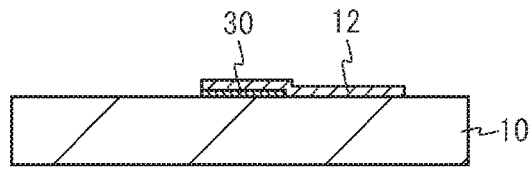
FIG. 4A through FIG. 4H are cross-sectional views illustrating a method of fabricating the piezoelectric thin film resonator in accordance with the first embodiment.
Figure 4E:
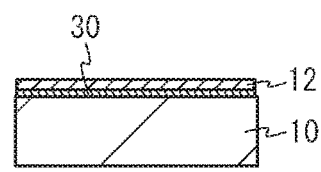

As illustrated in FIG. 4A and FIG. 4E, a sacrifice layer 30 is formed on the substrate 10 by, for example, sputtering, evaporation, or chemical vapor deposition (CVD). The sacrifice layer 30 is formed of, for example, a magnesium oxide (MgO) film, and is formed so as to include at least a region in which the air gap 20 is to be formed. The sacrifice layer 30 has a film thickness of, for example, approximately 20 nm. A metal film is then formed on the substrate 10 and the sacrifice layer 30 by sputtering under, for example, an argon (Ar) gas atmosphere. The metal film may be formed by evaporation or CVD. The metal film is selected from at least one of materials (Al, Cu, Cr, Mo, W, Ta, Pt, Ru, Rh, or Ir) listed for the lower electrode 12. Then, the metal film is formed into a desired shape to form the lower electrode 12 by, for example, photolithography and etching. At this time, a part of the lower electrode 12 is made to cover the sacrifice layer 30. The lower electrode 12 may be formed by liftoff.

Figure 4B:
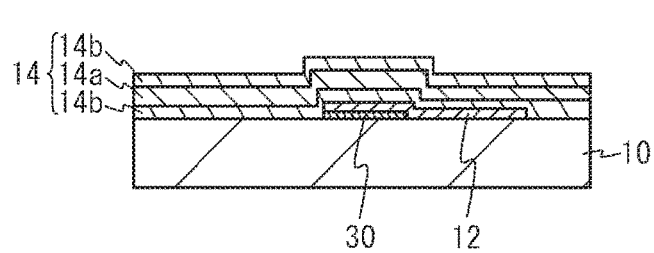
Figure 4F:
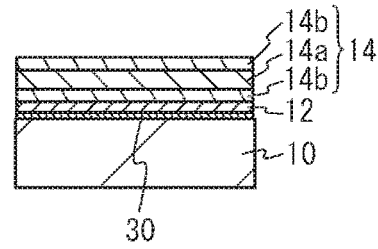

As illustrated in FIG. 4B and FIG. 4F, the piezoelectric film 14 made of an AlN film containing a II-group or XII-group element and a IV-group element is formed on the substrate 10 and the lower electrode 12. The piezoelectric film 14 is formed by sputtering using one target, which is an alloy target containing aluminum, the II-group or XII-group element, and the IV-group element, under an atmosphere containing nitrogen (for example, under a mixed gas atmosphere of nitrogen and rare gas (e.g., Ar)). The above-described target can be made by vacuum melting or vacuum sintering using aluminum, the II-group or XII-group element, and the IV-group element as source materials.

For example, to form the piezoelectric film 14 to which the elements of case 1 in Table 1 are added, an alloy target containing Al, Ca, and Ti is used. For case 2, an alloy target containing Al, Ca, and Zr is used, and for case 3, an alloy target containing Al, Ca, and Hf is used. For case 4, an alloy target containing Al, Mg, and Ti is used, for case 5, an alloy target containing Al, Mg, and Zr is used, and for case 6, an alloy target containing Al, Mg, and Hf is used. For case 7, an alloy target containing Al, Sr, and Hf is used. For case 8, an alloy target containing Al, Zn, and Ti is used, for case 9, an alloy target containing Al, Zn, and Zr is used, and for case 10, an alloy target containing Al, Zn, and Hf is used.

Figure 5:
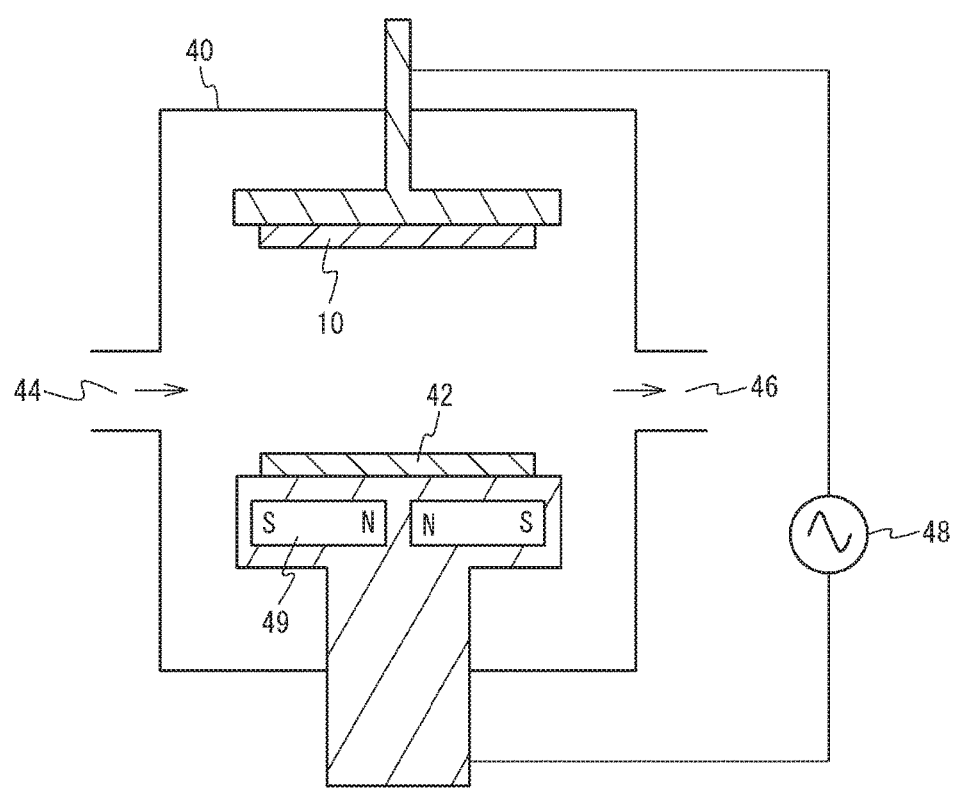
FIG. 5 illustrates a sputtering apparatus used to form a piezoelectric film.

FIG. 5 illustrates a sputtering apparatus used to form a piezoelectric film. As illustrated in FIG. 5, the sputtering apparatus is a general apparatus in reactive sputtering. In the sputtering apparatus, the substrate 10 and a target 42 are placed in a chamber 40 in which the piezoelectric film 14 is to be formed. The substrate 10 and the target 42 are arranged so as to face each other. Used as the target 42 is an alloy target containing aluminum, the II-group or XII-group element, and the IV-group element. The target 42 is coupled to a direct-current or high-frequency power source 48 located outside the chamber 40, and is capable of adjusting the voltage. The chamber 40 includes a gas supply portion 44 and a vacuum pump connection portion 46. To form the piezoelectric film 14, a gas in the chamber 40 is discharged through the vacuum pump connection portion 46 by a vacuum pump, and then a gas containing nitrogen (for example, a mixed gas of nitrogen and rare gas) is introduced from the gas supply portion 44.

Magnets 49 may be located under the target 42. The magnets 49 can improve the plasma density on the target 42, improving the film formation rate. Alternatively, a dual target sputtering apparatus that includes two targets 42 and alternately applies a voltage to the two targets 42 may be used. The use of the dual target sputtering apparatus reduces the charge up of an insulator produced on the surface of the target 42 and allows the surface of the target 42 to be cleaned, stabilizing the film formation.

In the above-described sputtering, by changing the sputtering power, the concentration of the II-group or XII-group element and the concentration of the IV-group element in the piezoelectric film 14 can be changed because of the difference in sputtering rate among the elements in the target 42. A description will be given of an experiment that examined the above fact. For the experiment, Mg was used as the II-group or XII-group element, and Hf was used as the IV-group element. Used was the target 42 in which the contained amount of Al was 80 atomic % and the contained amounts of Mg and Hf were 10 atomic % when the sum of the contained amounts of Al, Mg, and Hf was defined as 100 atomic %. Then the AlN film was formed while the sputtering power was varied, and the concentrations of Mg and Hf were measured.

Figure 6:
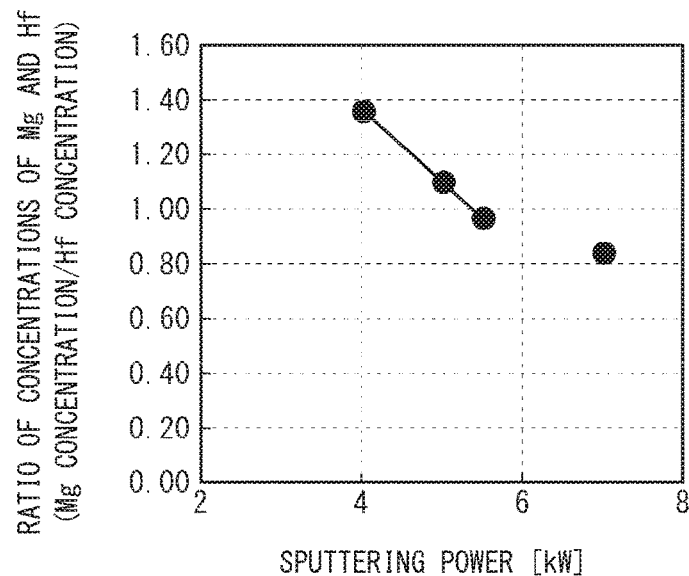
FIG. 6 illustrates a relationship between sputtering power and a ratio of concentrations of Mg and Hf.

FIG. 6 illustrates a relationship between the sputtering power and the ratio of concentrations of Mg and Hf. In FIG. 6, the horizontal axis represents sputtering power (kW), while the vertical axis represents the ratio of concentrations of Mg and Hf (the concentration of Mg/the concentration of Hf). As illustrated in FIG. 6, when the sputtering power is small, the concentration of Mg is greater than the concentration of Hf. When the sputtering power is high, the concentration of Hf is less than the concentration of Mg. The reason why the ratio of the concentration of Hf increases as the sputtering power increases is considered because Hf is heavier (the atomic weight is greater) than Mg. This reveals that the concentration of the additive element in the film can be adjusted by adjusting the sputtering power.

Therefore, the piezoelectric film 14 having the first region 14a in which the concentration of the IV-group element is high and the second region 14b in which the concentration of the IV-group element is low can be formed by adjusting the sputtering power in sputtering using an alloy target containing aluminum, the II-group or XII-group element, and the IV-group element as illustrated in FIG. 4B and FIG. 4F. As clear from FIG. 6, in the first region 14a, the concentration of the IV-group element becomes greater than the concentration of the II-group or XII-group element. In the second region 14b, the concentration of the II-group or XII-group element becomes greater than the concentration of the IV-group element.

Figure 4C:
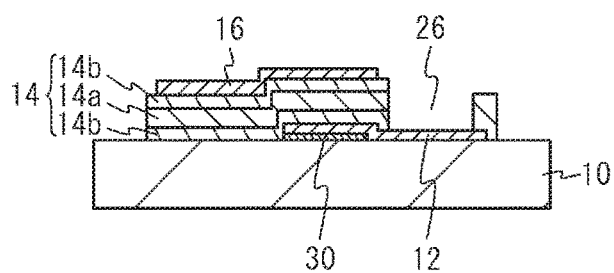
Figure 4G:
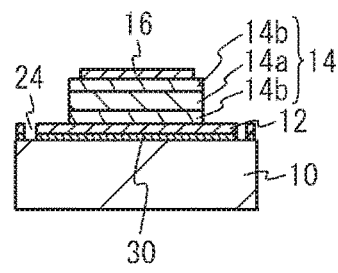

As illustrated in FIG. 4C and FIG. 4G, a metal film is formed on the piezoelectric film 14 by sputtering under, for example, an Ar gas atmosphere. The metal film may be formed by evaporation or CVD. This metal film is also selected from at least one of Al, Cu, Cr, Mo, W, Ta, Pt, Ru, Rh, or Ir as described previously. Then the metal film is formed into a desired shape to form the upper electrode 16 by photolithography and etching. The upper electrode 16 may be formed by liftoff. Then, the piezoelectric film 14 is formed into a desired shape by, for example, photolithography and etching. Furthermore, the hole 24 is formed by selectively etching the lower electrode 12 and the sacrifice layer 30.

Figure 4D:
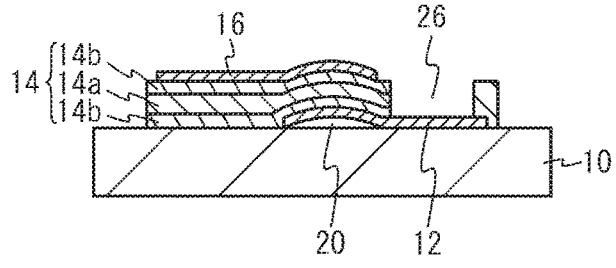
Figure 4H:
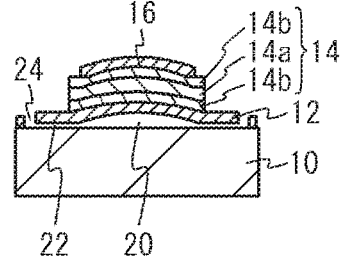

As illustrated in FIG. 4D and FIG. 4H, the sacrifice layer 30 is etched by introducing an etchant from the hole 24. Here, the stress of the multilayered film including the lower electrode 12, the piezoelectric film 14, and the upper electrode 16 is preliminarily set so as to be the compression stress. This setting causes the multilayered film to bulge out when the etching of the sacrifice layer 30 is completed, forming the air gap 20 having a dome-shaped bulge between the substrate 10 and the lower electrode 12. The introduction path 22 connecting the air gap 20 and the hole 24 is also formed. The above processes form the piezoelectric thin film resonator of the first embodiment.

Here, before an advantage of the piezoelectric thin film resonator 100 of the first embodiment is described, an experiment conducted on the piezoelectric thin film resonator 500 of the comparative example will be described. In the experiment, the lower electrode 72 was configured to have a two-layer structure having a chrome film with a film thickness of 100 nm and a ruthenium film with a film thickness of 200 nm stacked in this order from the substrate side. The piezoelectric film 74 was an AlN film with a film thickness of 1150 nm containing magnesium (Mg) as a II-group or XII-group element and hafnium (Hf) as a IV-group element. The upper electrode 76 was configured to have a two-layer structure having a ruthenium film with a film thickness of 200 nm and a chrome film with a film thickness of 50 nm stacked in this order from the piezoelectric film 74 side. The piezoelectric film 74 was made by sputtering using two targets: an aluminum target and an alloy target of aluminum, magnesium, and hafnium. Here, used as the alloy target of aluminum, magnesium, and hafnium was an alloy target having a composition of 80 atomic % aluminum, 10 atomic % magnesium, and 10 atomic % hafnium when the sum concentration of aluminum, magnesium, and hafnium is defined as 100 atomic %.

Figure 7A:
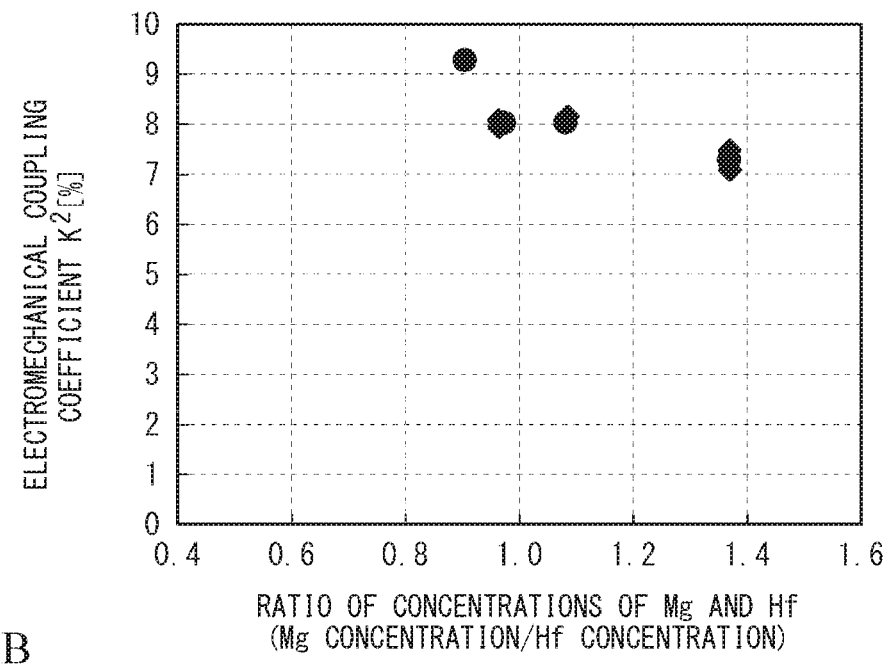
FIG. 7A illustrates a relationship between the ratio of concentrations of Mg and Hf and an electromechanical coupling coefficient $k^2$.
Figure 7B:
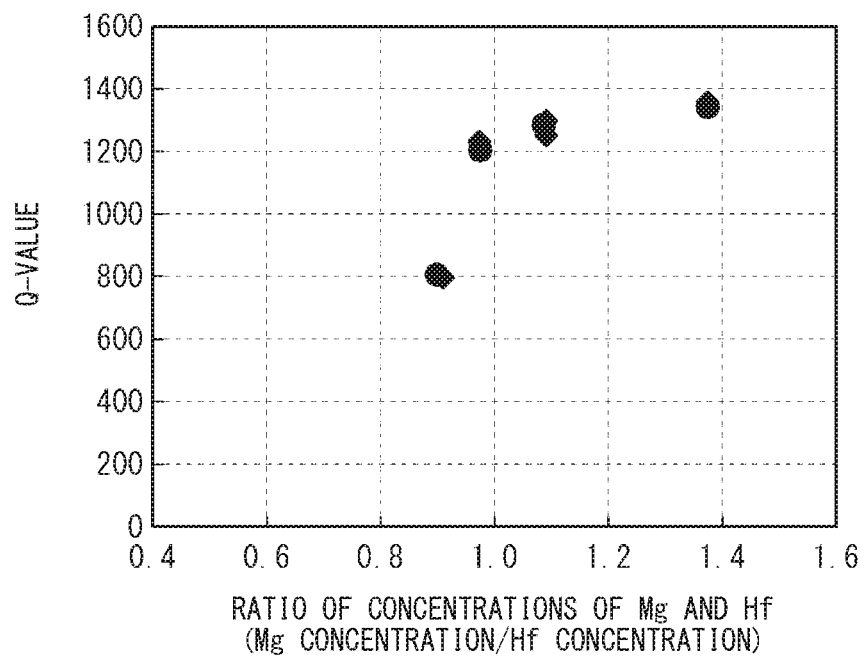
FIG. 7B illustrates a relationship between the ratio of concentrations of Mg and Hf and a Q-value.

FIG. 7A illustrates a relationship between the ratio of concentrations of Mg and Hf and the electromechanical coupling coefficient $k^2$, and FIG. 7B illustrates a relationship between the ratio of concentrations of Mg and Hf and the Q-value. In FIG. 7A, the horizontal axis represents the ratio of the concentration of Mg to the concentration of Hf (the concentration of Mg/the concentration of Hf), while the vertical axis represents the electromechanical coupling coefficient $k^2$. In FIG. 7B, the horizontal axis represents the ratio of the concentration of Mg to the concentration of Hf (the concentration of Mg/the concentration of Hf), while the vertical axis represents the Q-value at the antiresonant frequency. Presented are the results of when the concentration of Hf was varied while the concentration of Mg was maintained constant. As illustrated in FIG. 7A, as the ratio of concentrations of Mg and Hf decreased, the electromechanical coupling coefficient $k^2$ increased. On the other hand, as illustrated in FIG. 7B, as the ratio of concentrations of Mg and Hf increased, the Q-value at the antiresonant frequency increased. These results reveal that the electromechanical coupling coefficient $k^2$ increases when the concentration of Hf becomes greater than the concentration of Mg, and that the Q-value increases when the concentration of Mg becomes greater than the concentration of Hf. Although FIG. 7A and FIG. 7B present the results of when Mg and Hf were used, similar results are obtained even when other II-group or XII-group elements and other IV-group elements are used. In addition, similar results are obtained even when other II-group or XII-group elements and a V-group element are used.

In the first embodiment, in the first region 14a located in the middle region in the thickness direction of the piezoelectric film 14, the concentration of the IV-group element is higher than the concentration of the II-group or XII-group element. In the second regions 14b located in the end regions in the thickness direction of the piezoelectric film 14, the concentration of the II-group or XII-group element is higher than the concentration of the IV-group element. Since the strain energy of the thickness extension oscillation concentrates around the middle of the piezoelectric film 14, the electromechanical coupling coefficient $k^2$ is effectively improved by making the concentration of the IV-group element higher than the concentration of the II-group or XII-group element in the first region 14a. On the other hand, since the strain energy of the thickness extension oscillation is small around the end region in the thickness direction of the piezoelectric film 14, even when the concentration of the IV-group element is made to be greater than the concentration of the II-group or XII-group element in the end region, the electromechanical coupling coefficient $k^2$ is not improved so much. In contrast, since the Q-value is affected by the whole of the piezoelectric film 14, the decrease in Q-value can be reduced by making the concentration of the II-group or XII-group element higher than the concentration of the IV-group element in the second region 14b located in the end region in the thickness direction of the piezoelectric film 14. Accordingly, the electromechanical coupling coefficient $k^2$ is improved and the decrease in Q-value is reduced.

In addition, in the first embodiment, the piezoelectric film 14 made of an AlN film of which the concentration of the IV-group element in the first region 14a, which is located in the middle region in the thickness direction, is higher than those in the second regions 14b, which are located in the end regions in the thickness direction, is formed by changing the sputtering power between the middle region and the end regions in the thickness direction in sputtering using a target containing aluminum, the II-group or XII-group element, and the IV-group element. This process allows the concentration of the IV-group element to be higher than the concentration of the II-group or XII-group element in the first region 14a, and also allows the concentration of the II-group or XII-group element to be higher than the concentration of the IV-group element in the second region 14b. In addition, by forming the piezoelectric film 14 with use of a single target containing aluminum, the II-group or XII-group element, and the IV-group element, the piezoelectric film 14 having a stable composition is obtained compared to a case where a plurality of targets, for example, an aluminum target, a II-group or XII-group element target, and a IV-group element target are used. In addition, a general sputtering apparatus can be used because it is only required that a single target can be attached.

In addition, in the first embodiment, the concentration of the II-group or XII-group element is higher than the concentration of the IV-group element in both the second regions 14b located in the end regions in the thickness direction of the piezoelectric film 14. The concentration of the II-group or XII-group element may be higher than the concentration of the IV-group element in one of the second regions 14b, but the decrease in Q-value is effectively reduced by making the concentration of the II-group or XII-group element higher than the concentration of the IV-group element in both the second regions 14b located in the end regions.

According to Table 1, the combination of the II-group or XII-group element and the IV-group element is preferably a combination of magnesium and titanium, calcium and titanium, zinc and titanium, magnesium and zirconium, calcium and zirconium, zinc and zirconium, magnesium and hafnium, calcium and hafnium, strontium and hafnium, or zinc and hafnium.

In the first embodiment, the concentrations of the IV-group element in the first region 14a and the second region 14b may be constant or vary in the thickness direction of the piezoelectric film 14. The same applies to the II-group or XII-group element.

Figure 8:
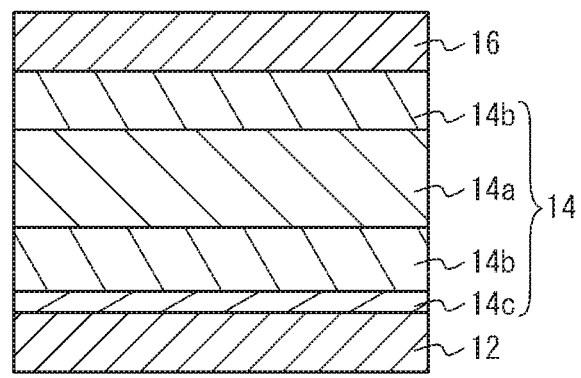
FIG. 8 is a cross-sectional view of the resonance region of a piezoelectric thin film resonator in accordance with a first variation of the first embodiment.

FIG. 8 is a cross-sectional view of the resonance region of a piezoelectric thin film resonator in accordance with a first variation of the first embodiment. As illustrated in FIG. 8, the piezoelectric film 14 includes a third region 14c between the lower electrode 12 and the second region 14b, the third region 14c being in contact with the lower electrode 12. The third region 14c is made of an AlN film to which no additive element is added (i.e., an undoped AlN film). The third region 14c can be formed by sputtering using an aluminum target under an atmosphere containing nitrogen before forming AlN films in the first region 14a and the second region 14b. Other structures are the same as those of the first embodiment, and the description thereof is thus omitted.

In the process of forming the piezoelectric film 14 made of an AlN film on the upper surface of the lower electrode 12, when an element is added to an AlN film, as the additive concentration of the element increases, it becomes more difficult to obtain the piezoelectric film 14 having a good c-axis orientation. However, in the first variation of the first embodiment, an undoped AlN film containing no additive element (the third region 14c) is located between an AlN film containing a II-group or XII-group element and a IV-group element (the first region 14a and the second region 14b) and the lower electrode 12. This structure allows the piezoelectric film 14 having a good c-axis orientation to be obtained, and improves the power durability of the piezoelectric thin film resonator. In addition, the adhesiveness between the lower electrode 12 and the piezoelectric film 14 is improved by forming an undoped AlN film (the third region 14c) on the upper surface of the lower electrode 12.

Figures 9A, 9B:
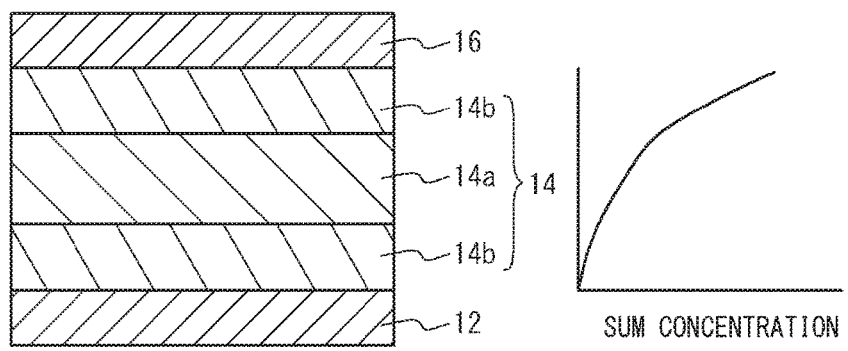
FIG. 9A is a cross-sectional view of the resonance region of a piezoelectric thin film resonator in accordance with a second variation of the first embodiment.
FIG. 9B illustrates a sum concentration of a II-group or XII-group element and a IV-group element in the thickness direction of the piezoelectric film.

FIG. 9A is a cross-sectional view of the resonance region of a piezoelectric thin film resonator in accordance with a second variation of the first embodiment, and FIG. 9B illustrates the sum concentration of the II-group or XII-group element and the IV-group element in the thickness direction of the piezoelectric film. In FIG. 9B, the horizontal axis represents the sum concentration of the II-group or XII-group element and the IV-group element, while the vertical axis corresponds to the thickness direction of the piezoelectric film. As illustrated in FIG. 9A and FIG. 9B, in the piezoelectric film 14, the sum concentration of the II-group or XII-group element and the IV-group element in the second region 14b closer to the lower electrode 12 is lower than that in the first region 14a located in the middle region. The piezoelectric film 14 configured as above can be formed by appropriately adjusting the sputtering power in the thickness direction. Other structures are the same as those of the first embodiment, and the description thereof is thus omitted.

In the second variation of the first embodiment, the sum concentration of the II-group or XII-group element and the IV-group element in the second region 14b closer to the lower electrode 12 is lower than that in the first region 14a located in the middle region. This structure makes the c-axis orientation of the piezoelectric film 14 good for the same reason as the reason described in the first variation of the first embodiment.

Second Embodiment

The first embodiment describes an exemplary case where the piezoelectric film 14 is an AlN film containing a II-group or XII-group element and a IV-group element. A second embodiment describes another exemplary case where the piezoelectric film 14 is an AlN film containing a II-group or XII-group element and a V-group element. That is, a piezoelectric thin film resonator in accordance with the second embodiment is the same as that of the first embodiment except that a V-group element is added to the piezoelectric film 14 instead of a IV-group element. The V-group element substitutes aluminum of an AlN film as with the IV-group element. The piezoelectric film resonator of the second embodiment can be made by using an alloy target containing aluminum, the II-group or XII-group element, and the V-group element instead of an alloy target containing aluminum, the II-group or XII-group element, and the IV-group element in the fabrication method described in FIG. 5A through FIG. 7.

Here, a description will be given of a simulation that examined the electromechanical coupling coefficient $k^2$ of a piezoelectric thin film resonator having the same structure as FIG. 1 and of which the piezoelectric film 74 is an AlN film containing a II-group or XII-group element and a V-group element. In the simulation, the lower electrode 72 was assumed to be formed of a multilayered film of a chrome (Cr) film with a film thickness of 100 nm and a ruthenium (Ru) film with a film thickness of 225 nm. The piezoelectric film 74 was assumed to be an AlN film with a film thickness of 1000 nm containing a II-group or XII-group element and a V-group element. Magnesium (Mg) or zinc (Zn) was used as the II-group or XII-group element, and tantalum (Ta), niobium (Nb), or vanadium (V) was used as the V-group element. The concentration of the II-group or XII-group element was assumed to be 12.5 atomic %, and the concentration of the V-group element was assumed to be 6.25 atomic %. This configuration is for maintaining the insulation property of the piezoelectric film 74. Values calculated by the first principle calculation were used for the values of the material constants such as the piezoelectric constant, the elastic constant, and the permittivity of the piezoelectric film 74. The upper electrode 76 was assumed to be formed of a multilayered film of a Ru film with a film thickness of 225 nm and a Cr film with a film thickness of 30 nm. In addition, a silicon oxide ($SiO_2$) film with a film thickness of 50 nm was assumed to be located on the upper electrode 76.

Table 2 presents simulation results of the electromechanical coupling coefficient $k^2$ of the piezoelectric thin film resonator. For comparison, also presented are simulation results of the electromechanical coupling coefficient $k^2$ of a piezoelectric thin film resonator having the same structure except that an undoped AlN film with a film thickness of 1150 nm is used for the piezoelectric film 74. As presented in Table 2, when an AlN film containing a II-group or XII-group element and a V-group element was used for the piezoelectric film (case 1 to case 6), the electromechanical coupling coefficient $k^2$ is greater than the electromechanical coupling coefficient $k^2$ of when an undoped AlN film was used for the piezoelectric film. As described above, since the Q-value is in a trade-off relationship with the electromechanical coupling coefficient $k^2$, when an AlN film containing a II-group or XII-group element and a V-group element is used for the piezoelectric film, the Q-value is small.

TABLE 2

| Combination | II-group or XII-group element | V-group element | Resonant frequency [MHz] | Antiresonant frequency [MHz] | $k^2$ [%] |
| --- | --- | --- | --- | --- | --- |
| Case 1 | Mg | Ta | 1910.3 | 2086.1 | 17.6 |
| Case 2 | Mg | Nb | 1977.0 | 2107.6 | 14.3 |
| Case 3 | Mg | V | 1835.5 | 1993.4 | 16.8 |
| Case 4 | Zn | Ta | 1968.3 | 2096.9 | 14.2 |
| Case 5 | Zn | Nb | 1926.9 | 2047.1 | 13.6 |
| Case 6 | Zn | V | 2080.1 | 2179.4 | 10.7 |
| Aluminum nitride | — | — | 1963.0 | 2024.0 | 7.22 |

As described above, also in the piezoelectric thin film resonator in which an AlN film containing a II-group or XII-group element excluding radioactive elements and a V-group element excluding radioactive elements is used for the piezoelectric film, the electromechanical coupling coefficient $k^2$ improves, but the Q-value decreases.

Thus, also in the second embodiment, the concentration of the V-group element is made to be higher than the concentration of the II-group or XII-group element in the first region 14a located in the middle region in the thickness direction of the piezoelectric film 14. In the second regions 14b located in the end regions in the thickness direction of the piezoelectric film 14, the concentration of the II-group or XII-group element is made to be greater than the concentration of the V-group element. This configuration achieves both the improvement of the electromechanical coupling coefficient $k^2$ and the reduction of decrease in Q-value for the same reason as the first embodiment.

In addition, the piezoelectric film 14 made of an AlN film in which the concentration of the V-group element in the first region 14a located in the middle region in the thickness direction is higher than those in the second regions 14b located in the end regions in the thickness direction is formed by changing the sputtering power between the middle region and the end regions in the thickness direction in sputtering using a target containing aluminum, the II-group or XII-group element, and the V-group element. This process allows the concentration of the V-group element to be higher than the concentration of the II-group or XII-group element in the first region 14a, and allows the concentration of the II-group or XII-group element to be higher than the concentration of the V-group element in the second region 14b.

For example, to form the piezoelectric film 14 to which the elements of case 1 in Table 2 are added, an alloy target containing Al, Mg, and Ta is used. For case 2, an alloy target containing Al, Mg, and Nb is used, and for case 3, an alloy target containing Al, Mg, and V is used. For case 4, an alloy target containing Al, Zn, and Ta is used, for case 5, an alloy target containing Al, Zn, and Nb is used, and for case 6, an alloy target containing Al, Zn, and V is used.

According to Table 2, the combination of the II-group or XII-group element and the V-group element is preferably a combination of magnesium and tantalum, magnesium and niobium, magnesium and vanadium, zinc and tantalum, zinc and niobium, or zinc and vanadium.

Also in the second embodiment, as in the first variation of the first embodiment, the piezoelectric film 14 may include the third region 14c made of an AlN film containing no additive element on the upper surface of the lower electrode 12. As in the second variation of the first embodiment, the sum concentration of the II-group or XII-group element and the V-group element in the second region 14b closer to the lower electrode 12 of the piezoelectric film 14 may be lower than that in the first region 14a located in the middle region.

Figure 10A:
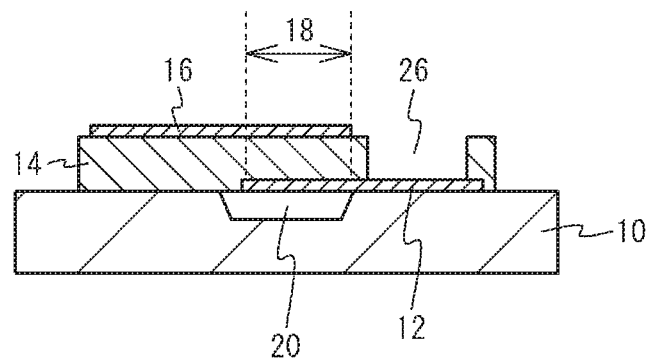
FIG. 10A and FIG. 10B are cross-sectional views of piezoelectric thin film resonators illustrating other examples of an air gap.
Figure 10B:
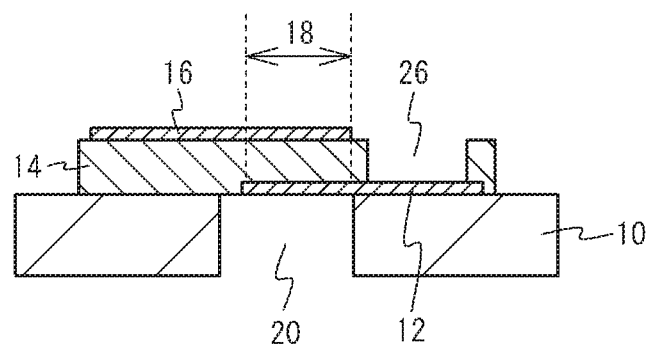

The first and second embodiments describe an exemplary case where the air gap 20 is formed of a dome-shaped bulge between the substrate 10 and the lower electrode 12, but do not intend to suggest any limitation. FIG. 10A and FIG. 10B are cross-sectional views of piezoelectric thin film resonators illustrating other examples of the air gap. For simplicity's sake, FIG. 10A and FIG. 10B omit the illustration of the first region 14a and the second region 14b in the piezoelectric film 14. As illustrated in FIG. 10A, the air gap 20 may be formed by removing a part of the substrate 10 under the lower electrode 12 in the resonance region 18. As illustrated in FIG. 10B, the air gap 20 may be formed so as to penetrate through the substrate 10 under the lower electrode 12 in the resonance region 18.

Figure 10C:
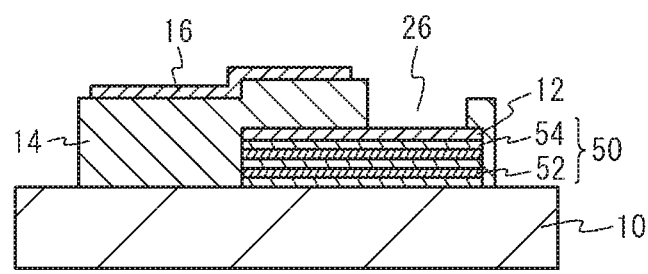
FIG. 10C is a cross-sectional view of an SMR-type piezoelectric thin film resonator.

The piezoelectric thin film resonator is not limited to a Film Bulk Acoustic Resonator (FBAR) type, and may be a Solid Mounted Resonator (SMR) type. FIG. 10C is a cross-sectional view of an-SMR type piezoelectric thin film resonator. For simplicity's sake, FIG. 10C omits the illustration of the first region 14a and the second region 14b of the piezoelectric film 14. As illustrated in FIG. 10C, in the SMR-type piezoelectric thin film resonator, an acoustic mirror 50 in which a film 52 with high acoustic impedance and a film 54 with low acoustic impedance are alternately stacked, the film thicknesses of the films 52 and 54 being, for example, λ/4 (λ is the wavelength of the acoustic wave).

Third Embodiment

Figure 11:
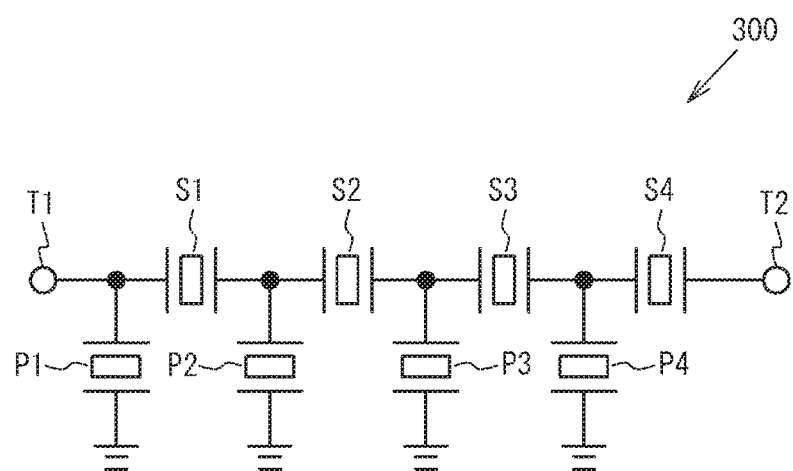
FIG. 11 illustrates a filter in accordance with a third embodiment.

FIG. 11 illustrates a filter in accordance with a third embodiment. As illustrated in FIG. 11, a filter 300 of the third embodiment is a ladder-type filter including one or more series resonators S1 through S4 connected in series and one or more parallel resonators P1 through P4 connected in parallel between input/output terminals T1 and T2. At least one of the series resonators S1 through S4 and the parallel resonators P1 through P4 may be the piezoelectric thin film resonator of any one of the first and second embodiments.

Fourth Embodiment

Figure 12:
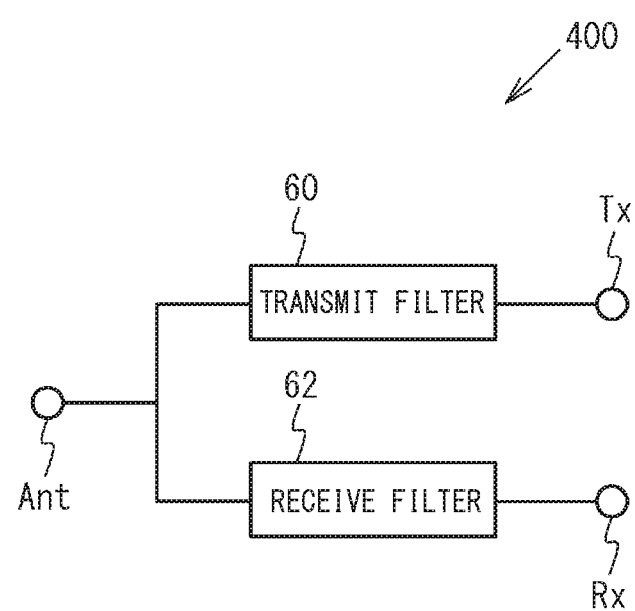
FIG. 12 illustrates a duplexer in accordance with a fourth embodiment.

FIG. 12 illustrates a duplexer in accordance with a fourth embodiment. As illustrated in FIG. 12, a duplexer 400 of the fourth embodiment includes a transmit filter 60 connected between an antenna terminal Ant and a transmit terminal Tx, and a receive filter 62 connected in series between the antenna terminal Ant and a receive terminal Rx. The transmit filter 60 and the receive filter 62 have different passbands. The transmit filter 60 transmits signals in the transmit band to the antenna terminal Ant as transmission signals among signals input from the transmit terminal Tx, and suppresses signals in other bands. The receive filter 62 transmits signals in the receive band to the receive terminal Rx as reception signals among signals input from the antenna terminal Ant, and suppresses signals in other bands. At least one of the transmit filter 60 and the receive filter 62 may be the filter of the third embodiment.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
   a substrate;
   a piezoelectric film located on the substrate, the piezoelectric film including an aluminum nitride film containing a II-group or XII-group element and a IV-group or V-group element, a concentration of the IV-group or V-group element being higher than a concentration of the II-group or XII-group element in a middle region in a thickness direction, the concentration of the II-group or XII-group element being higher than the concentration of the IV-group or V-group element in at least one of end regions in the thickness direction; and
   a lower electrode and an upper electrode facing each other across the piezoelectric film.

2. A filter comprising:
   the piezoelectric thin film resonator according to claim 1.

3. A duplexer comprising:
   the filter according to claim 2.

4. The piezoelectric thin film resonator according to claim 1, wherein
   the concentration of the II-group or XII-group element is higher than the concentration of the IV-group or V-group element in both the end regions in the thickness direction of the aluminum nitride film.

5. The piezoelectric thin film resonator according to claim 1, wherein
   the aluminum nitride film contains the II-group or XII-group element and the IV-group element, and
   a combination of the II-group or XII-group element and the IV-group element is a combination of magnesium and titanium, calcium and titanium, zinc and titanium, magnesium and zirconium, calcium and zirconium, zinc and zirconium, magnesium and hafnium, calcium and hafnium, strontium and hafnium, or zinc and hafnium.

6. The piezoelectric thin film resonator according to claim 1, wherein
the aluminum nitride film contains the II-group or XII-group element and the V-group element, and
a combination of the II-group or XII-group element and the V-group element is a combination of magnesium and tantalum, magnesium and niobium, magnesium and vanadium, zinc and tantalum, zinc and niobium, or zinc and vanadium.

7. The piezoelectric thin film resonator according to claim 1, wherein
a sum concentration of the II-group or XII-group element and the IV-group or V-group element of the aluminum nitride film in an end region closer to the lower electrode of the end regions is lower than a sum concentration of the II-group or XII-group element and the IV-group or V-group element of the aluminum nitride film in the middle region.

8. The piezoelectric thin film resonator according to claim 1, wherein
the piezoelectric film includes another aluminum nitride film containing no additive element between the aluminum nitride film and the lower electrode.

9. A method of fabricating a piezoelectric thin film resonator, the method comprising:
forming a piezoelectric film on a lower electrode by sputtering using a target containing aluminum, a II-group or XII-group element, and a IV-group or V-group element, the piezoelectric film including an aluminum nitride film of which a concentration of the IV-group or V-group element in a middle region in a thickness direction is higher than a concentration of the IV-group or V-group element in at least one of end regions in the thickness direction, the aluminum nitride film being formed by changing a sputtering power between the middle region and the at least one of the end regions in the thickness direction in the sputtering; and
forming an upper electrode on the piezoelectric film, the upper electrode facing the lower electrode across the piezoelectric film.

* * * * *